(12) United States Patent
Verschuuren et al.

(10) Patent No.: US 10,018,751 B2
(45) Date of Patent: Jul. 10, 2018

(54) SPATIAL POSITIONING OF PHOTON EMITTERS IN A PLASMONIC ILLUMINATION DEVICE

(71) Applicant: KONINKLIJKE PHILIPS N.V., Eindhoven (NL)

(72) Inventors: Marcus Antonius Verschuuren, Eindhoven (NL); Gabriel Sebastian Lozano Barbero, Eindhoven (DE); Jaime Gomez Rivas, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/312,297

(22) PCT Filed: May 21, 2015

(86) PCT No.: PCT/EP2015/061191
§ 371 (c)(1),
(2) Date: Nov. 18, 2016

(87) PCT Pub. No.: WO2015/181034
PCT Pub. Date: Dec. 3, 2015

(65) Prior Publication Data
US 2017/0082785 A1 Mar. 23, 2017

(30) Foreign Application Priority Data
May 27, 2014 (EP) .................... 14170048

(51) Int. Cl.
*G02F 1/03* (2006.01)
*G02B 5/00* (2006.01)
(Continued)

(52) U.S. Cl.
CPC ............... *G02B 5/008* (2013.01); *F21K 9/64* (2016.08); *F21V 9/16* (2013.01); *F21V 9/30* (2018.02);
(Continued)

(58) Field of Classification Search
CPC ... G02B 5/008; F21K 9/64; F21V 9/16; G02F 1/29; H01L 33/507; H01L 33/58; H01L 33/502; H01L 33/50
(Continued)

(56) References Cited

U.S. PATENT DOCUMENTS

2003/0181122 A1  9/2003  Collins et al.
2008/0029778 A1  2/2008  Kim et al.
(Continued)

FOREIGN PATENT DOCUMENTS

EP   13179374.7   8/2013

OTHER PUBLICATIONS

EPO as ISA, "International Search Report and Written Opinion" dated Jul. 23, 2015 from International Application No. PCT/EP2015/061191, filed May 21, 2015, 15 pages.
(Continued)

*Primary Examiner* — Euncha Cherry

(57) ABSTRACT

There is provided an illumination device (100) comprising: a substrate (104); an optically transmissive first layer (106) arranged on the substrate; a photon emitting layer (108), arranged on the optically transmissive first layer and comprising a photon emitting material configured to receive energy from an energy source and to emit light having a predetermined wavelength; a periodic plasmonic antenna array, arranged on the substrate and embedded within the first layer, and comprising a plurality of individual antenna elements (114) arranged in an antenna array plane, the plasmonic antenna array being configured to support a first lattice resonance at the predetermined wavelength, arising from coupling of localized surface plasmon resonances in the individual antenna elements to photonic modes supported by the system comprising the plasmonic antenna array and the photon emitting layer, wherein the plasmonic
(Continued)

antenna array is configured to comprise plasmon resonance modes such that light emitted from the plasmonic antenna array has an anisotropic angle distribution; and wherein the photon emitting layer is arranged at a distance from the antenna array plane corresponding to a location of maximum field enhancement for light out-coupling resulting from the plasmonic-photonic lattice resonances.

16 Claims, 5 Drawing Sheets

(51) Int. Cl.
*F21V 9/30* (2018.01)
*H01L 33/50* (2010.01)
*H01L 33/58* (2010.01)
*G02F 1/29* (2006.01)
*F21K 9/64* (2016.01)
*F21V 9/16* (2006.01)

(52) U.S. Cl.
CPC .............. *G02F 1/29* (2013.01); *H01L 33/507* (2013.01); *H01L 33/58* (2013.01); *G02F 2203/10* (2013.01); *H01L 33/508* (2013.01)

(58) Field of Classification Search
USPC ......................................................... 359/244
See application file for complete search history.

(56) References Cited

U.S. PATENT DOCUMENTS

2010/0126566 A1 5/2010 Ji
2012/0153254 A1* 6/2012 Mastro .................... H01L 33/40
257/13
2013/0286633 A1 10/2013 Rahimzadeh et al.

OTHER PUBLICATIONS

Catchpole et al., "Novel Applications for Surface Plasmons in Photovoltaics", 3rd World Conference on Photovoltaic Energy Conversion, May 11-18, 2001, Osaka, Japan, pp. 2714-2717.
Extended European Search Report dated Nov. 19, 2014, European Application No. 14170048.4, 11 pages.
Article 94(3) EPC dated Nov. 8, 2017, European Application No. 15724268.6, 5 pages.

* cited by examiner

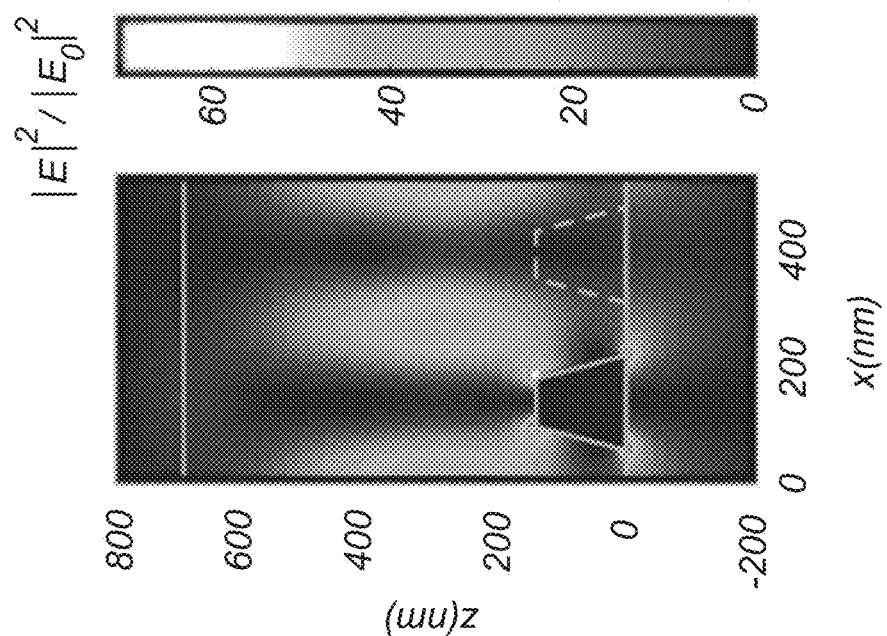
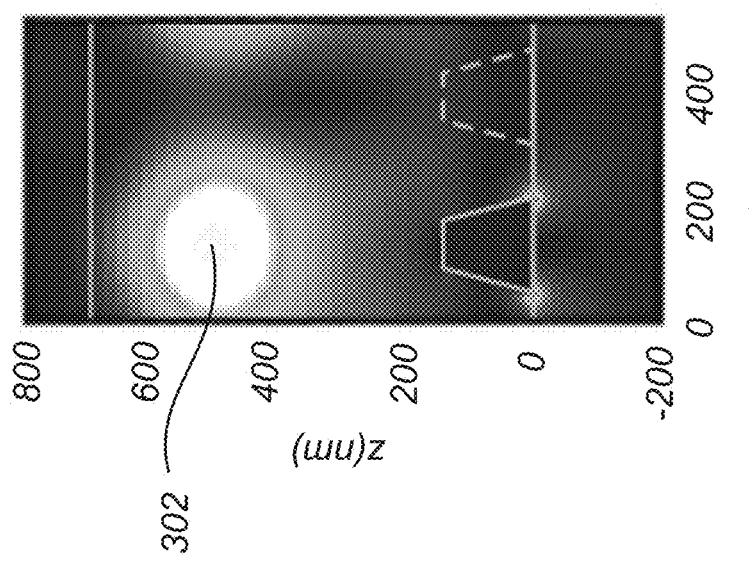
Fig. 3b
Fig. 3a

SPATIAL POSITIONING OF PHOTON EMITTERS IN A PLASMONIC ILLUMINATION DEVICE

CROSS-REFERENCE TO RELATED APPLICATIONS

The present application is a § 371 application of International Application No. PCT/EP2015/061191 filed on May 21, 2015 and entitled "SPATIAL POSITIONING OF PHOTON EMITTERS IN A PLASMONIC ILLUMINATION DEVICE," which claims the benefit of European Patent Application No. 14170048.4, filed May 27, 2014. PCT/EP2015/061191 and EP 14170048.4 are incorporated herein.

FIELD OF THE INVENTION

The present invention relates to a plasmonic illumination device. In particular, the present invention relates to optimized spatial positioning of emitters in a plasmonic illumination device, and to a method for manufacturing such a device.

BACKGROUND OF THE INVENTION

For light emitting diodes (LEDs) for use in lighting applications, it is desirable to provide essentially white light having a color temperature approximately comparable to that produced by incandescent lighting.

White light from LEDs is commonly provided by using a pn-diode emitting blue light, having a wavelength around 450 nm, where part of the blue light is converted to longer wavelengths using one or more wavelength converting materials arranged on top of or in the vicinity of the diode. By combining the converted light with the unabsorbed blue light, a reasonably broadband spectrum which is perceived as white light can be obtained.

Currently, in most commercial applications, the wavelength converting material is applied directly on the LED. Furthermore, the wavelength converting material is often scattering in order to obtain a low variation in color over angle. This means that blue light will also be scattered back into the diode which leads to absorption losses in the LED. Moreover, the active component of the wavelength converting material, commonly phosphor, is an isotropic emitter, meaning that the same amount of wavelength converted light is emitted in all directions. This leads to further losses as only a portion of the light escapes through the output surface of the light emitting device.

The problem of reducing losses has for example been addressed by using a phosphor which is less scattering to reduce the amount of blue light which is backscattered and absorbed by the diode. However, the isotropic emission from the phosphor remains.

The amount of light leaving the light emitting device may also be increased by introducing a photonic band gap material in which the emission direction can be modified. However, to be able to control the emission direction, a photonic band gap material needs to be made from materials having a high refractive index contrast, high aspect ratio holes or pillars must be patterned and formed, the size control is very strict and the material must be luminescent which will incur scattering losses. Furthermore, a photonic band gap material is only really effective in the plane perpendicular to the surface of the material, i.e. in a direction parallel to the holes or pillars.

Accordingly, the suggested approaches for increasing the emission efficiency of a light emitting device suffer from inherent drawbacks which are hard to overcome.

SUMMARY OF THE INVENTION

In view of the above-mentioned desired properties of an illumination device, and the above-mentioned and other drawbacks of the prior art, it is an object of the present invention to provide an improved illumination device.

Therefore an illumination device is provided comprising: a substrate; an optically transmissive first layer arranged on the substrate; a photon emitting layer, arranged on the optically transmissive first layer and comprising a photon emitting material configured to receive energy from an energy source and to emit light having a predetermined wavelength; a periodic plasmonic antenna array, arranged on the substrate and embedded within the first layer, and comprising a plurality of individual antenna elements arranged in an antenna array plane, the plasmonic antenna array being configured to support a first lattice resonance at the predetermined wavelength, arising from coupling of localized surface plasmon resonances in the individual antenna elements to photonic modes supported by the system comprising the plasmonic antenna array and the photon emitting layer, wherein the plasmonic antenna array is configured to comprise plasmon resonance modes such that light emitted from the plasmonic antenna array has an anisotropic angle distribution; and wherein the photon emitting layer is arranged at a distance from the antenna array plane corresponding to a location of maximum field enhancement for light out-coupling resulting from the plasmonic-photonic lattice resonances.

The antenna array plane is herein defined as the plane of the substrate surface on which the antenna elements are located.

A location of maximum field enhancement maximum refers to the location where the largest value of the intensity enhancement (IE) attained for a given frequency can be found in the volume of the photon emitting layer. However, the location of maximum field enhancement may also be understood as a range, region or sub-volume in space where the field enhancement is higher than a given threshold value. The maximum field enhancement may thus be a local maximum. Moreover, the field enhancement at a given distance from the antenna array plane may be determined as an average field enhancement in a plane parallel to the antenna array plane, at the given distance.

In the present device, the distance between the antenna array plane and the photon emitting layer is defined by the thickness of the optically transmissive first layer in which the antenna elements are embedded. The thickness of the first layer is easily controllable to a high degree of accuracy using conventional deposition techniques known in the field of light emitting devices and/or semiconductor technologies.

The field of plasmonics refers to the interaction of small conducting structures, typically metal structures, with light, whereby the size of the metal structures is similar to the wavelength of the light. The conduction electrons in the metal respond to an external electric field and the electron cloud oscillates at the driving optical frequency, leaving behind a more positive charged area, which pulls back the electrons. Due to the small size of the metal structures, the resonances can reach the frequencies of visible light. As a result, a metal structure can have a large scatter cross-section which allows a strong interaction with any light that is incident on the metal particles or with any light that is generated in close proximity to the metal particles.

It has been found that regular arrays exhibit strong enhancement in directionality of the emission which is attributed to hybrid coupled Localized Surface Plasmon Resonance (LSPR) and photonic modes, also referred to as hybrid lattice plasmonic photonic modes, or plasmonic-photonic lattice resonances. The directionality enhancement of the emission is herein referred to as anisotropic emission, i.e. non-Lambertian emission.

Ordered arrays of optical antennas support collective lattice resonances. When the wavelength of the radiation is in the order of the periodicity of the array, a diffracted order can radiate in the plane of the array. In this way the localized surface plasmon polaritons sustained by the individual particles may couple via diffraction leading to collective, lattice-induced, hybrid photonic-plasmonic resonances known as surface lattice resonances (SLRs). These delocalized modes extend over several unit cells, making it possible to obtain a collective enhancement of the emission from emitters distributed over large volumes as it is required in solid-state lighting.

Here, use is made of periodic arrays of nanoparticles that behave as collective nano-antennas. These arrays sustain collective plasmonic resonances. On the one hand, metallic nanoparticles have large scattering cross sections that allow resonant excitation of phosphors in the wavelength converting material, thereby enhancing the conversion of light. On the other hand, collective plasmonic resonances enable shaping the angular pattern of the emission, beaming most of the light into a very narrow angular range in a defined direction. Therefore, directional enhancement is explained as the combination of an increased efficiency in the excitation of the photon emitting medium and an enhancement of the out-coupling efficiency of the emission of the phosphors to extended plasmonic-photonic modes in the array and the subsequent out-coupling to free-space radiation.

A more detailed description of the function of the plasmonic antenna array can be found in WO2012/098487, and in unpublished European patent application EP13179374.

The present invention is based on the realization that coupling between the photon emitting material and the plasmonic-photonic lattice resonances supported by the array can be increased by means of an accurate positioning of the photon emitting material with respect to the antenna array. In general, a photon emitting layer may comprise particles, or emitters, which are homogeneously distributed throughout the layer. However, as it has been realized that the field distribution from lattice resonance modes is far from homogeneous, an improved coupling efficiency can be achieved by arranging photon emitting material, for example in the form of particles, where the field enhancement from the resonance modes is strongest, e.g. at a distance from the antenna array plane, in the direction of the surface normal, where the highest field is observed. Thereby, through an increased coupling efficiency, an improved directionality of light emitted from the illumination device can be provided and losses in the photon emitting layer are reduced.

According to one embodiment of the invention, the photon emitting material may advantageously be a wavelength converting material configured to receive light of a first wavelength and to convert the received light from the first wavelength to a second wavelength.

In one embodiment of the invention, the antenna array may advantageously be configured to provide a spatial distribution of maximum field enhancement being substantially homogeneous in a plane parallel to and at a distance from the antenna array plane, for light out-coupling resulting from the plasmonic-photonic lattice resonances, and the photon emitting material may then advantageously be distributed in a plane of the photon emitting layer corresponding to the homogeneous spatial distribution of maximum field enhancement. The field enhancement resulting from the plasmonic antenna array is inhomogeneous in three dimensions. However, the antenna array may advantageously be configured such that the field enhancement is homogeneous in a plane at a given distance from the antenna array in a direction of the normal of the antenna array plane. Thereby, an optimized overlap between the in-plane homogeneous field enhancement and a planar homogeneous photon emitting layer can be achieved, which in turn results in an optimized coupling efficiency. A field enhancement which is in-plane homogeneous should be understood as having a certain extension in the direction normal to the plane, and should not be regarded as a strictly two-dimensional distribution. The extension of the distribution may also be matched to the thickness of the photon emitting layer, or vice versa. Furthermore, the plasmonic antenna array may also be configured and arranged so that the field distribution is inhomogeneous in a plane at a distance from the antenna array plane. For such a configuration, the wavelength converting particles may have a corresponding varying concentration in the plane at a given distance from the antenna array plane, where concentrations are higher at locations where the field intensity is higher. Thereby, the coupling efficiency can be further improved also for an in-plane inhomogeneous field enhancement.

According to one embodiment of the invention, the photon emitting material may advantageously be distributed in a volume of the photon emitting layer corresponding to a three dimensional (3D) spatial distribution of maximum field enhancement for light out-coupling resulting from said lattice resonances. To achieve an optimized correlation between the location of photon emitting and/or wavelength converting particles and high field intensity, and thereby the highest coupling efficiency, the wavelength converting particles may preferably be distributed in three dimensions in accordance with the 3D spatial field distribution, so that the spatial overlap between the wavelength converting particles and the locations of maximum field enhancement is maximized.

According to one embodiment of the invention, a refractive index of the optically transmissive first layer may advantageously be higher than the refractive index of the substrate to support refractive-index guided modes. Arrays of metal nanoparticles can support delocalized plasmonic-photonic hybrid states due to localized surface plasmon polaritons (LSPPs) as described above coupled to diffracted or refractive-index guided modes. In order to support the refractive-index guided modes, the refractive index of the layer in which the antenna array is arranged should be higher than that of the substrate. Diffractive and waveguide coupling give rise to collective lattice modes known as surface lattice resonances and waveguide-plasmon polaritons, respectively. These resonances are responsible for large field enhancements that extend away from the antenna elements in the volume in which the wavelength converting material is located. Thereby, even further enhancement of the field can be achieved at known locations in the wavelength converting layer. Moreover, depending on the particular set of refractive indexes, a minimum total thickness of the stack of layers on the substrate might be required to sustain waveguide modes in the optically transmissive first layer.

According to one embodiment of the invention, the plasmonic antenna array may advantageously be configured to comprise plasmon resonance modes being out-of plane asymmetric. By configuring the plasmonic antenna array to provide an asymmetric emission of light, more of the light emitted by the antenna array can be emitted towards the emitting surface of the illumination device. This leads to an increased overall efficiency of the illumination device since a larger portion of the generated light is emitted from the selected light emitting surface of the device. The illumination device can be configured such that light is primarily emitted either through the substrate or from the wavelength converting layer away from the substrate. Out-of plane asymmetric plasmon resonance modes may for example be achieved by making the antenna elements asymmetric, for example having the shape of a pyramid, a truncated pyramid, a cone or a truncated cone. Thereby, the resulting resonant modes for each antenna element become asymmetric which in turn leads to asymmetric light emission properties. The asymmetric shape of the antenna element refers to the asymmetry of a cross section of such an element in a plane parallel to the longitudinal axis of the antenna element, i.e. cross section in a vertical plane of a "standing" antenna element.

The tapering of the antenna element is important for the asymmetry of the emission. In particular, the asymmetry is based on the simultaneous excitation of electric and magnetic resonances in the antenna elements. As will be further explained below, it is mainly the magnetic and magneto-electric (cross-coupled) response which is enhanced by the broken symmetry. The magnetic response is the response of the antenna element to the magnetic field of the incident light, whereas magneto-electric refers to the excitation of electric fields by incident magnetic fields, and vice versa.

It is known from electrodynamics that a single electric dipole coupled to a single magnetic dipole can tailor the forward/backward scattering ratio depending on the relative phase of the dipoles. Typically, most materials do not have a magnetic response at optical frequencies, so the effect is hardly found for light. However, metallic nanostructures can be designed to sustain magnetic excitations of strength comparable to their electric ones. Moreover, these two different excitations may cross-couple, leading to a magneto-electric response.

Increasing the tapering of the antenna elements (where tapering refers to the ratio of the diameter or side at the base to the diameter or side at the top) increases both the magnetic and the magneto-electric response. Thus, by increasing the tapering, the two responses are increased and an antenna array exhibiting an increased asymmetry can be designed. It is also noted that the asymmetry of emission from these structures relies on them having electric and magnetic excitations of similar amplitudes.

In one embodiment of the invention, the wavelength converting material may advantageously be selected from the group comprising rare earth ions, dye molecules and quantum dots. The wavelength converting material may be a material that comprises different types of dyes and phosphors known by the person skilled in the art. Furthermore, the wavelength converting medium may also comprise a line emitter in the form of an ion of a rare earth element. Wavelength converting materials may also be referred to as fluorescent materials, phosphors or dyes, and in general as photon emitters.

In one embodiment of the invention, the wavelength converting layer may comprise a quantum well structure. A quantum well structure can be fabricated on top of the first layer, and both the optical properties and physical thickness can be controlled to achieve the desired wavelength converting properties. The quantum well may be configured to receive energy in the form of photons and to emit photons of a different wavelength, or the quantum well may be configured to be electrically driven to emit photons of the predetermined wavelength. Alternatively a plasmonic lattice can be defined on top of epitaxially grown layers of light emitting materials, e.g. III-V semi-conductors such as GaN/InGaN or AlInGaP, where the light emitting layer (quantum wells) are located on a defined distance from the plasmonic lattice.

In one embodiment of the invention, the antenna elements may advantageously be arranged in a hexagonal array having a lattice constant in the range of 450 to 500 nm, the refractive index of the substrate is 1.46 and the refractive index of the optically transmissive first layer is 1.59. This array configuration will achieve directional emission of substantially red light in the direction of the normal to the antenna array plane. To achieve directional emission for other wavelengths or in other directions, the geometry of the antenna array and the refractive indices will have to be tuned accordingly.

Moreover, the photon emitting layer may advantageously be arranged at a distance from the antenna array plane in the range of 100 to 2000 nm and the thickness of the photon emitting layer may be in the range of 2 to 500 nm. A quantum well structure typically has a thickness of about 2 to 20 nm, whereas a photon emitting layer comprising wavelength converting particles may have a thickness from about 25 nm up to 500 nm.

According to one embodiment of the invention, the antenna elements may advantageously comprise a metal nanoparticle, in particular the antenna elements may advantageously comprise Ag, Al, Ga or Au. The material from which the antenna elements are formed should preferably support localized plasmons at frequencies corresponding to visible light. In general, Au is more suitable for the red to near-infrared part of the spectrum, Ag for the green to red part of the spectrum and Al allows for plasmon resonances that extend beyond the visible region of the spectrum into the ultraviolet. However, as the wavelength range also depend on the configuration of the antenna array and the geometry of the antenna elements, several different configurations may provide resonances within similar wavelength ranges.

In one embodiment of the invention, the illumination device may further comprise a cover layer arranged on the wavelength converting layer, where the cover layer has the same refractive index as said wavelength converting layer. The spectral position of the lattice modes for a given antenna geometry depends on the total thickness of the layer or layers arranged to cover the antennas, and on the refractive index of such layer/layers. Therefore, a cover layer may be employed on the wavelength converting layer to achieve a targeted total thickness of the first optically transmissive layer. In general, the wavelength converting layer is based on a material having the same or a similar refractive index as the first optically transmissive layer. Moreover, the wavelength converting layer may be sufficiently thin so as not have a large influence on the optical properties of the material stack comprising the first optically transmissive layer, the wavelength converting layer and the cover layer, for example in the case of a quantum dot or quantum well layer.

An additional layer, i.e. a top layer, arranged on the cover layer and having a lower refractive index than the top layer, may also be provided to further facilitate controlled waveguide modes.

According to one embodiment of the invention, the antenna array may comprise a plurality of truncated pyramidal antenna elements having a top side in the range of 110 to 130 nm, a bottom side in the range of 135 to 155 nm, and a height in the range of 100 to 200 nm, and wherein said antenna elements are arranged in a hexagonal array having a lattice constant in the range of 400 to 600 nm. The sides refer to the lengths of the sides of for example a square, rectangle or triangle. In embodiments the antenna elements are made from aluminum. Specifically, in order to achieve a beamed emission in for red light (600-630 nm range) a hexagonal array with a pitch of 475 nm is used covered with a 650 nm thick layer of optically transparent polymers with a refractive index of n=1.59, from which part of the layer holds perylene dye molecules or quantum dots. The determination of the pitch of the antenna array based on a desired emission angle and emission wavelength can be based on a calculation of the Rayleigh anomaly giving an approximate estimate of the relations. For a square array, lattice modes can be excited at normal incidence at a wavelength $\lambda=a*n$ with a being the pitch of the array and n the refractive index. For hexagonal arrays $\lambda=a*n*\sqrt{3}/2$.

According to a second aspect of the invention, there is provided a method for manufacturing an illumination device, the method comprising: providing a substrate; on the substrate, forming a periodic plasmonic antenna array comprising a plurality of individual antenna elements, the plasmonic antenna array being configured to support a first lattice resonance at a predetermined wavelength, arising from coupling of localized surface plasmon resonances in the individual antenna elements to photonic modes supported by a system comprising the plasmonic antenna array and a wavelength converting layer, wherein the plasmonic antenna array is configured to comprise plasmon resonance modes; providing an photosensitive layer on the substrate, the photosensitive layer having a thickness exceeding a thickness of the antenna elements; illuminating the plasmonic antenna array with light of the predetermined wavelength such that a portion of the photosensitive layer is exposed corresponding to a location of maximum field enhancement for light out-coupling resulting from the lattice resonances of the plasmonic antenna array; removing the exposed portion of the layer to form a plurality of cavities; and refilling the cavities with a wavelength converting material configured to convert light from a first wavelength to the predetermined wavelength.

A fully optimized system requires an emitter which is patterned in three dimensions, as to maximize the overlap with the hybrid photonic/plasmonic modes. The present inventors have realized that it is possible to form a distribution of wavelength converting material which is inherently optimized to the field enhancement distribution of the plasmonic antenna array by allowing the regions of maximum field intensity to expose a photosensitive material. By illuminating the sample with the correct wavelength and angle (future emission wavelength and emission angle) the electromagnetic field will be concentrated by the plasmonics in the photosensitive layer. In this way the layer can be developed after exposure which leaves a resist pattern (positive or negative) which corresponds to the optimal placement of the emitters. By infiltrating and/or reversing the pattern the emitters are placed in the correct 3D pattern. The photosensitive layer may be any conventionally used positive or negative photo resist.

In order to illuminate the antenna array so as to achieve the desired field enhancement distribution, either the substrate or the photosensitive layer is optically transmissive. It must obviously be ensured that the illuminating light is limited in intensity so that the photosensitive layer is not exposed by the illumination from the light source.

Thereby, a self-aligned three-dimensional distribution of the wavelength converting material perfectly matching the distribution of maximum field enhancement can be achieved without the need for any complex patterning methods, which greatly increases the availability of the abovementioned illumination device.

A three-dimensional distribution of the wavelength converting material can also be obtained by applying layers of transparent materials on top of which an emitter layer is lithographically patterned and aligned to the plasmonic pattern. Alternatively a self-assembly type of fabrication method can be used where the plasmonic antennas guide the assembly to in the end position the emitters at the correct position with respect to the plasmonic array in 3D.

Effects and features of this second aspect of the present invention are largely analogous to those described above in connection with the first aspect of the invention.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

This and other aspects of the present invention will now be described in more detail, with reference to the appended drawings showing embodiments of the invention.

FIG. 3 is a schematic illustration of the spatial distribution of the local field enhancement in a unit cell of an illumination device according to an embodiment of the invention.

DETAILED DESCRIPTION

Figure 1:
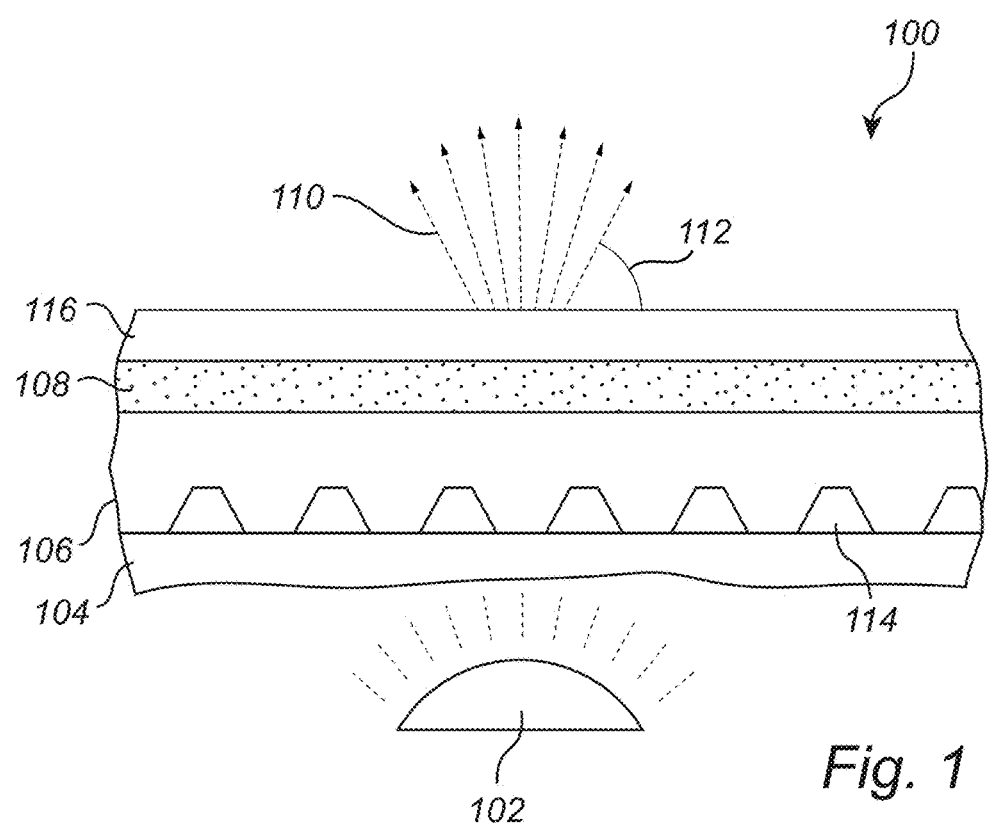
FIG. 1 is a schematic illustration of an illumination device according to an embodiment of the invention.

The present invention will now be described more fully hereinafter with reference to the accompanying drawings, in which exemplary embodiments of the invention are shown. This invention may, however, be embodied in many different forms and should not be construed as limited to the embodiments set forth herein; rather, these embodiments are provided for thoroughness and completeness, and fully convey the scope of the invention to the skilled person. Like reference characters refer to like elements throughout.

In the present detailed description, various embodiments of the illumination device according to the present invention are mainly discussed with reference to an illumination device with a photon emitting layer comprising wavelength converting particles. It should be noted that this by no means limits the scope of the present invention which is equally applicable to other types of photon emitters which may be comprised in the illumination device.

FIG. 1 is a schematic illustration of an illumination device 100 comprising a substrate 104, an optically transmissive polymer layer 106 arranged on the substrate, a wavelength converting layer 108 comprising a wavelength converting material in the form of a plurality of wavelength converting particles. The optically transmissive layer 106 is here referred to as a polymer layer. However, any suitable optically transmissive material having a refractive index matching the refractive index of the wavelength conversion layer may be used. The wavelength converting particles, i.e. photon emitters, may for example be dye molecules configured to convert blue light into light having longer wavelengths. Typically, it is desirable to achieve white-light by wavelength converting of blue or UV light from InGaN-based LEDs by suitable color converters, known as phosphors. In general, the wavelength converting particles may be excited through addition of any type of energy such as photons, heat, electrons, x-rays etc. The illumination device 100 is illustrated as receiving light from a light source 102. Suitable dye molecules may be provided in a polymer to provide a desired dye concentration in a polymer-based wavelength converting layer 108. A top layer or a cover layer 116 in the form of a polymer layer is arranged on top of the wavelength converting layer 108. For example, the same polymer may be used for all three layers. As described above, depending on the particular configuration of antenna array and refractive indices, a certain thickness of the material stack, having the refractive index of the first optically transmissive layer 106, may be required. The cover layer 116 may then be formed form the same polymer material as the first optically transmissive layer 106 to reach the required thickness. Additionally, one more layers may be arranged on top of the cover layer 116, where the additional layer may be of a material having a lower refractive index than a refractive index of the first optically transmissive layer 106 and the cover layer 116 to further facilitate refractive-index guided modes in the stack of layers 106, 108 and 116. Air, which inherently has a lower refractive index than the first optically transmissive layer, and lower than a possible top or cover layer 116, will also facilitate refractive-index guided modes. It should be noted that the drawings are not to scale, and in particular that the wavelength converting layer 108 may be substantially thinner than the first optically transmissive layer 106. For example, a wavelength converting layer comprising quantum dots or a quantum well may have a thickness on the order of a few nanometers whereas a first optically transmissive layer 106 may have a thickness on the order of hundreds of nanometers up to a micrometer.

The illumination device 100 further comprises a periodic plasmonic antenna array comprising a plurality of individual antenna elements 114 arranged in an antenna array plane, here defined by the substrate plane on which the antenna elements 114 are arranged.

The antenna array is arranged on the substrate 104 and within the first layer 106. Furthermore, the antenna array is configured to support lattice resonances at the second wavelength, emitted by the wavelength converting material, arising from diffractive coupling of localized surface plasmon resonances in the individual antenna elements such that light emitted from the plasmonic antenna array has an anisotropic angle distribution 110 illustrated in FIG. 1. However, the antenna elements may equally well have a polygonal or circular cross section, and they may or may not be truncated. Moreover, in FIG. 1 the antenna elements 114 are illustrated as truncated pyramids having a square cross section such that the plasmonic antenna array is configured to comprise plasmon resonance modes being out-of plane asymmetric, meaning that light emitted from the plasmonic antenna array has an asymmetric light distribution. The asymmetric light distribution may have the effect that more of the light emitted by the antenna array is emitted towards the top surface of the illumination device than what is emitted towards the substrate. The plasmonic antenna array can also be configured to provide the opposite effect, i.e. that more of the light emitted by an antenna array is emitted towards the substrate compared to what is emitted towards the light emitting surface. That may for example be useful when using a transparent substrate. Also the angle distribution of emitted light from the light emitting surface can be controlled, illustrated by angle 112, such that light is emitted within a predetermined angle range.

Refractive-index guided modes are achieved by selecting the refractive index of the first optically transmissive layer 106, the wavelength converting layer 108, and the cover layer 116, to be different from the refractive index of the substrate 104 and from the refractive index of the medium on top of the cover layer, which may be air or an additional layer.

The antenna elements 114 may be aluminum nanoparticles fabricated on a silica substrate 104 using a nanoimprint lithography technique, so called substrate conformal imprint lithography, in combination with reactive ion etching. The first optically transmissive layer 106 consists of a UV-curable polymer deposited by spin coating over the array, and the polymer based wavelength converting layer 108 and the cover layer 116 may likewise be deposited by spin coating. Consequently, by controlling the thickness of the first polymer layer 106, the distance between the antenna array plane and the wavelength converting layer 108 can be controlled accurately. It can be assumed that the dye molecules are evenly distributed within the wavelength converting layer 108. The wavelength converting layer may have a thickness less than 10 nm. For some lattice modes, the extension of the maximum field intensity region may be below 10 nm, and it is accordingly desirable to provide a wavelength converting layer having a corresponding thickness. An even thinner wavelength converting layer having a thickness in the order of one or a few nanometers may for example be achieved by a quantum well structure.

Figure 2A:
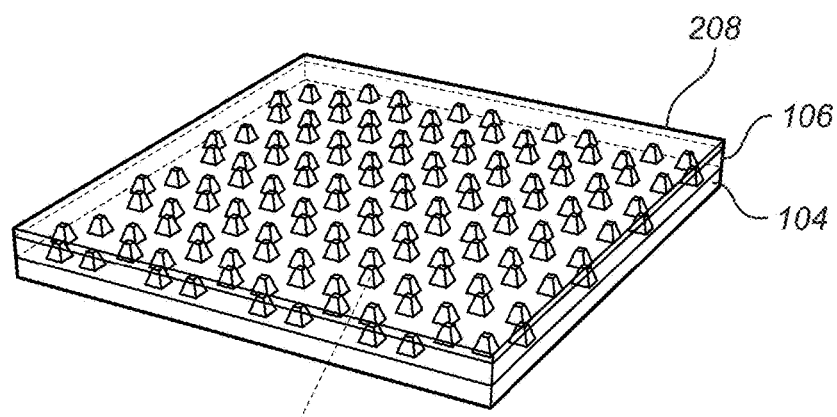
FIGS. 2a-c are schematic illustrations of illumination devices according to embodiments of the invention.

FIG. 2a is a schematic illustration of an illumination device where the antenna elements 114 are arranged in a hexagonal array having a lattice constant in the range of 400 to 600 nm on the substrate 104 and within the first layer 106. The antenna array comprises a plurality of truncated pyramidal Al antenna elements having a top side, i.e. the length of one side of, in this case, a square, but a rectangle or triangle are also possible, in the range of 110 to 130 nm, a bottom side in the range of 135 to 155 nm, and a height in the range of 100 to 200 nm, and the antenna elements are arranged in a hexagonal array. The antenna elements are embedded in a material with a refractive index of about 1.59 and the substrate has a refractive index of 1.46. The above configuration is tailored to support lattice modes corresponding to light in the red wavelength range. It should be noted that other geometries of antenna elements and array configurations may be required to achieve the different effects described herein, where an in-plane homogeneous field enhancement distribution for example is a achieved by a square array having an inter-element distance in the range of 350 to 450 nm and antenna elements having a height of about 40 nm and a square cross-section of about 100×100 nm. The cross-section of the antenna elements is in that case square both as seen from above and from the side.

Figures 2B, 2C:
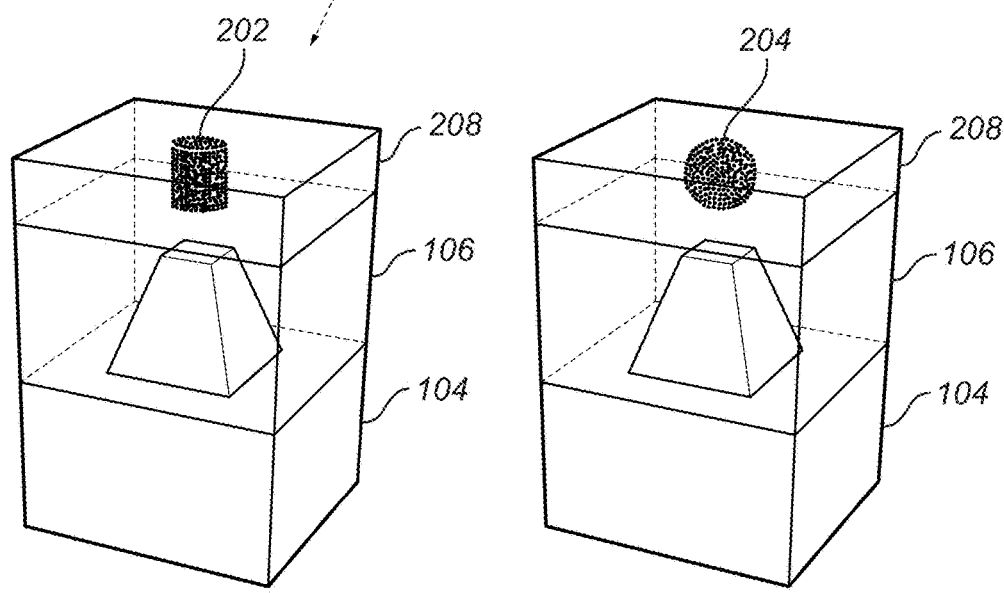

Assuming that the field enhancement is highest directly above the antenna element 114, a high coupling efficiency can be achieved by providing a distribution of the wavelength converting material in the wavelength converting layer 208 such that wavelength converting particles are only present in the regions 202 above the antenna elements 114 as illustrated by FIG. 2b. In other words, there is a 2D distribution of the wavelength converting particles corresponding to the locations of maximum field intensity, here represented by a cylindrical shape 202 in FIG. 2b. The illustrated distribution of wavelength converting particles may for example be achieved by patterning the wavelength converting layer using photolithography.

As the field enhancement has a spatial distribution in three dimensions, an optimal coupling efficiency can be achieved by arranging the distribution of wavelength converting particles in three dimensions to achieve a maximum spatial overlap between the location of the wavelength converting particles and the spatial field intensity profile of a given lattice mode. This 3D distribution is schematically illustrated in FIG. 2c where the wavelength converting particles are arranged in a roughly spherical shape 204. The spherical shape 204 is merely an example to illustrate the general concept, and is readily realized that the field intensity profile may have different shapes for different modes of the array and for different wavelengths, and that the distribution of the wavelength converting particles will have to configured accordingly.

FIGS. 3a-b schematically illustrates numerical simulations of the spatial distribution of the total electrical field intensity (E) normalized to the incident field intensity ($E_0$) for a hexagonal array of aluminum nanoparticles arranged over a substrate having a refractive index of 1.46 covered by a 700 nm-thick layer of polymer material having a refractive index of 1.59. The simulations consider a plane wave incident normal to the array with a wavelength of 620 nm for FIG. 3a and 638 nm for FIG. 3b. Results are shown in a unit cell of the array. Thus, it can be seen that the field intensity is inhomogeneous and significantly higher at a certain distance from the antenna array. It can also be seen that the distribution of the field intensity enhancement is different for different wavelengths.

For a wavelength of 620 nm as illustrated by FIG. 3a, the local field intensity is mostly enhanced in a substantially spherical region 302 located 500 nm above the plane of the antenna array, approximately corresponding to the 3D distribution 204 illustrated in FIG. 2c. This is thus the height selected to position the wavelength converting layer in order to optimize the intensity of the emission at λ=620 nm in the normal direction.

To optimize the distribution of the photon emitters within the wavelength converting layer, it is necessary to investigate the different electric field components ($E_x$, $E_y$, $E_z$). The most prominent component will set the preferential location of the photon emitters to maximize the emitted light in that direction. The integrated intensity enhancement, IE, is defined as:

$$IE(\lambda, \Omega) = \frac{\int_V |E(\vec{r}, \lambda, \Omega)|^2 dV}{\int_V |E_{ref}(\vec{r}, \lambda, \Omega)|^2 dV}$$

where Ω is the solid angle associated to the elevation and the azimuthal angle of emission, E ($\vec{r}$, λ, Ω) is the local field at the wavelength λ and at the position $\vec{r}$ where each photon emitter is located and V is the volume over which the emitters are distributed. $E_{ref}(\vec{r}, \lambda, \Omega)$ correspond to the local field in the absence of an antenna array. Calculations show that IE integrated over the phosphor layer as a function of the free space wavelength is above 25 for a wavelength converting layer located 450 nm above the plane of the array. In a similar way, it is possible to determine to optimal distance to the wavelength converting layer for light of other wavelengths. Notice that the intensity of the light emitted at the wavelength λ in the direction Ω is proportional to the local field intensity calculated at this wavelength and the same direction.

Via the reciprocity principle, the calculated IE can be correlated to the photoluminescence enhancement, which for the above configuration shows a photoluminescence improvement of about 50% compared to if the photon emitters are homogeneously distributed throughout all polymer layers. The improvement can be attributed to the improved coupling efficiency for the investigated wavelength in the investigated direction. In a layer having a homogeneous distribution of photon emitters, the emitters are randomly dispersed. However, as the field distribution of a particular lattice mode is not homogeneous, most of the emitters in the phosphor layer do not couple efficiently to such a lattice mode as the coupling efficiency is proportional to the spatial overlap between the location of the emitters and the spatial profile of the lattice mode.

Numerical simulations as described above allow an accurate mapping of the spatial regions where an increase of the light-matter interaction, signaled by a large electromagnetic field, occurs. Such insight serves as a guide to engineer the spatial distribution and orientation of the photon emitters with respect to the antenna array. Consequently, it is possible to maximize the coupling between the emitters and a given resonance mode supported by the antenna array.

Additionally, instead of a wavelength converting material providing the emitters, a quantum-well (QW) structure as used in LEDs can be optimally used to couple to plasmonic arrays. Especially as the QW is typically a few nanometers thick, all the photons (or energy) is located in a small volume which allows for a high optimization of the system, such that most of the energy injected in the QW by electron/hole pairs can couple to the desired photonic/plasmonic hybrid mode and therefore obtain optimal directionality. A comparatively thin wavelength converting layer, as provided by a QW structure, may be advantages where the intensity enhancement is substantially homogeneous in a plane parallel to the antenna array plane, and/or when intensity enhancement has a comparatively small extension in the direction of the normal to the antenna array plane.

The illumination device may also comprise additional wavelength converting layers, with other distributions of wavelength converting particles, to accommodate field enhancement distributions of different lattice resonance modes.

FIGS. 4a-e schematically illustrates the steps of an exemplary method for manufacturing an illumination device as described above.

Figure 4A:
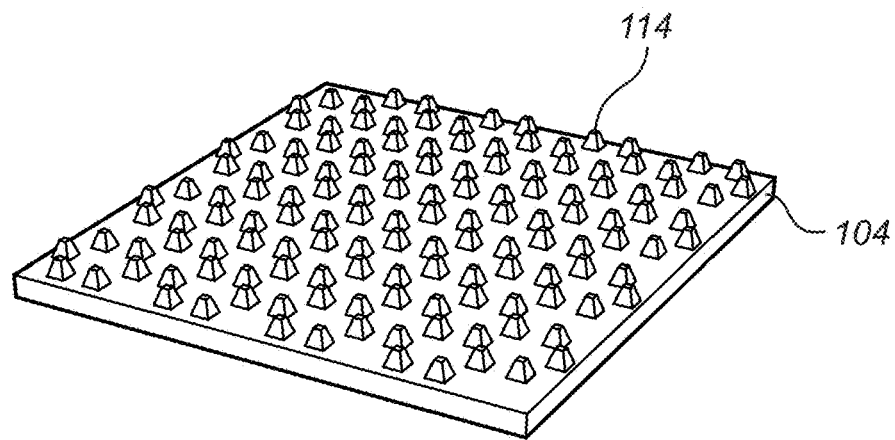
FIGS. 4a-e are schematic illustrations of steps of an exemplary method of manufacturing an illumination device according to an embodiment of the invention.

First, illustrated in FIG. 4a, a substrate 104 is provided and a periodic plasmonic antenna array comprising a plurality of individual antenna elements 114 is formed on the substrate. Possible configurations of the antenna array are outlined above.

Figure 4B:
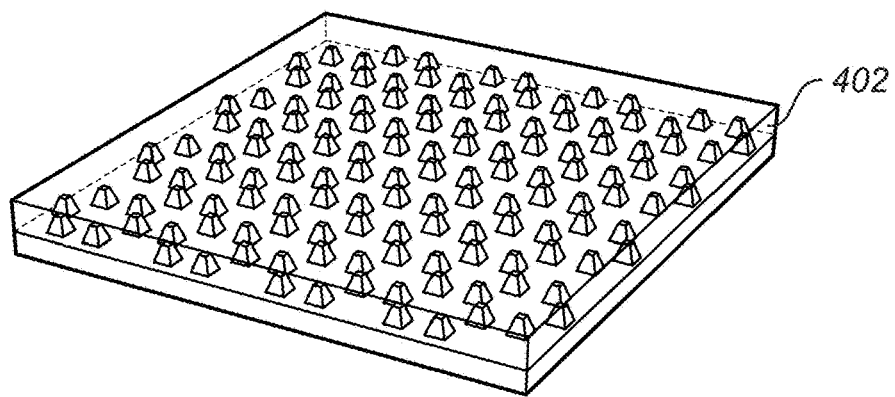

Next, in FIG. 4b, a photosensitive layer 402 is arranged on said substrate to cover the antenna elements. The photosensitive layer can for example be a positive photoresist.

Figure 4C:
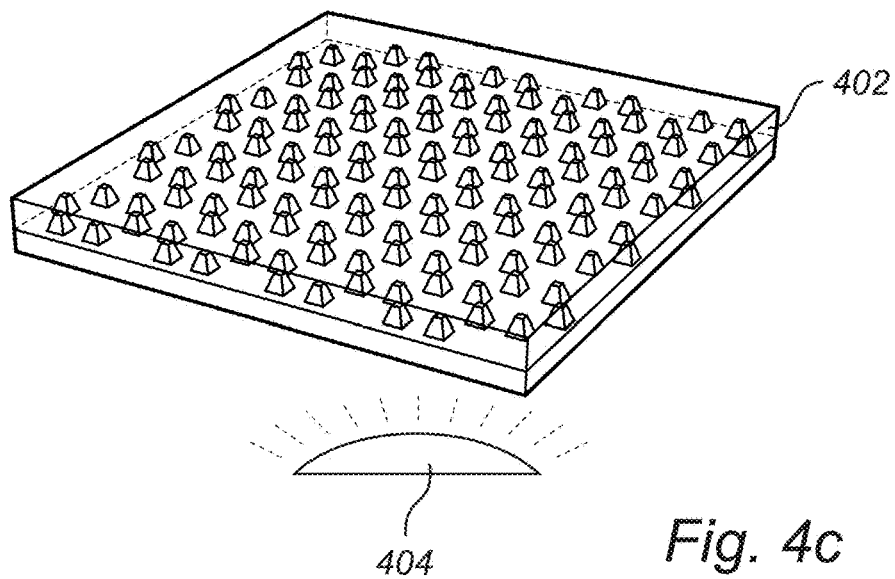

In FIG. 4c, the plasmonic antenna array is illuminated with light 404 of the wavelength for which the antenna array is configured to support plasmonic-photonic lattice resonances. This will, through reciprocity build up similar field intensities in the light sensitive resist layer as in the final system such that a portion of the photosensitive layer is exposed corresponding to a location of maximum field enhancement for light out-coupling resulting from the lattice resonances of the plasmonic antenna array. Here, the illumination is illustrated as being provided through the substrate, meaning that the intended direction of light emission is through the substrate. However, it is equally possible to configure the device so that light is emitted through the photosensitive layer 402 away from the substrate, in which case the illumination is provided through the photosensitive layer 402. The thickness and refractive index of the photosensitive layer should match the final emissive structure so that the reciprocity principle can be applied.

In either case, the relation between the photosensitivity of the resist and the intensity of the illuminating light must be tuned so that the resist is only exposed where the intensity is significantly enhanced in comparison to tin intensity of the incident light.

Figure 4D:
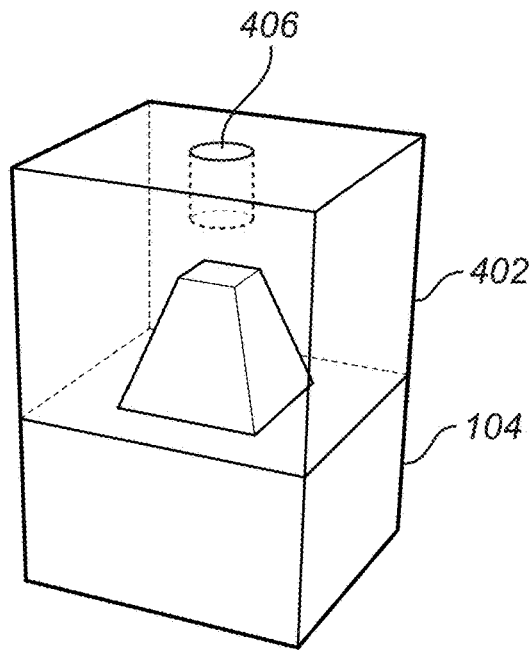

FIG. 4d schematically illustrates that a portion 406 of the photosensitive layer 402 has been exposed and subsequently removed such that a cavity 406 is formed.

Figure 4E:
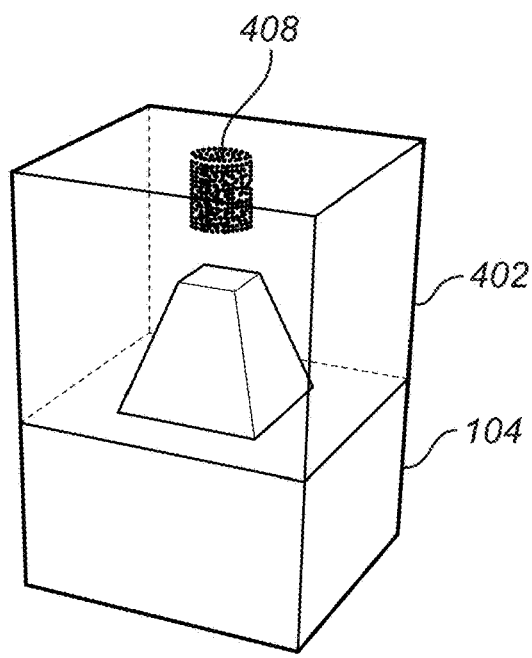

Finally, in FIG. 4e, it is illustrated that the cavity 406 is refilled with a wavelength converting material 408. Subsequent layers may then be added as required for the particular application at hand.

A 3D distribution may thus be provided by making use of a self-aligning system using a conventional photo resist, thereby positioning the emitters in a 3D manner in the optimum position.

Alternatively, a 3D distribution of wavelength converting particles may also be achieved by successive patterning of aligned thin layers to build up the desired 3D distribution of wavelength converting particles.

Additionally, variations to the disclosed embodiments can be understood and effected by the skilled person in practicing the claimed invention, from a study of the drawings, the disclosure, and the appended claims. Moreover, many different configurations and combinations are possible.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. An illumination device comprising:
a substrate;
an optically transmissive first layer arranged on the substrate;
a photon emitting layer, arranged on the optically transmissive first layer and comprising a photon emitting material configured to receive energy from an energy source and to emit light having a predetermined wavelength;
a periodic plasmonic antenna array, arranged on the substrate and embedded within and covered by the optically transmissive first layer, and comprising a plurality of individual antenna elements arranged in an antenna array plane, the plasmonic antenna array being configured to support a first lattice resonance at the predetermined wavelength, arising from coupling of localized surface plasmon resonances in the individual antenna elements to at least one photonic resonance mode by combining the plasmonic antenna array and the photon emitting layer, wherein the plasmonic antenna array is configured to comprise plasmon resonance modes such that light emitted from the plasmonic antenna array has an anisotropic angle distribution; and
wherein the photon emitting layer is arranged at a distance from the antenna array plane corresponding to a location of maximum field enhancement for light out-coupling resulting from plasmonic-photonic lattice resonances.

2. The illumination device of claim 1, wherein the photon emitting material is a wavelength converting material configured to receive light of a first wavelength and to convert the received light from the first wavelength to a second wavelength.

3. The illumination device of claim 1, wherein the antenna array is configured to provide a spatial distribution of maximum field enhancement being substantially homogeneous in a plane parallel to, and at a distance from the antenna array plane, for light out-coupling resulting from the plasmonic-photonic lattice resonances, and
wherein the photon emitting material is distributed in a plane of the photon emitting layer corresponding to the spatial distribution of maximum field enhancement.

4. The illumination device of claim 1, wherein the photon emitting material is distributed in a volume of the photon emitting layer corresponding to a three dimensional spatial distribution of maximum field enhancement for light out-coupling resulting from the plasmonic-photonic lattice resonances.

5. The illumination device of claim 1, wherein a first refractive index of the optically transmissive first layer is higher than a second refractive index of the substrate to support refractive-index guided modes.

6. The illumination device of claim 1, wherein the plasmonic antenna array is configured to comprise plasmon resonance modes being out-of plane asymmetric.

7. The illumination device of claim 2, wherein the wavelength converting material is selected from at least one of, a first group comprising rare earth ions, or a second group comprising dye molecules, or a third group comprising quantum dots.

8. The illumination device of claim 1, wherein the photon emitting layer comprises a quantum well structure.

9. The illumination device of claim 1, wherein the antenna elements are arranged in a hexagonal array having a lattice constant in a range of about 450 nm to about 500 nm, and wherein a refractive index of the substrate is about 1.46 and a refractive index of the optically transmissive first layer is about 1.59.

10. The illumination device of claim 9, wherein the photon emitting layer is arranged at a distance in a range of about 100 nm to about 2000 nm from the antenna array plane.

11. The illumination device of claim 10, wherein a thickness of the photon emitting layer is in the range of about 2 nm to about 500 nm.

12. The illumination device of claim 1, wherein the antenna element is a metal nanoparticle selected from a group comprising any of, Ag, or Al, or Ga, or Au.

13. The illumination device of claim 1, further comprising a cover layer arranged on the photon emitting layer, the cover layer having a substantially same refractive index as the photon emitting layer.

14. The illumination device of claim 1, wherein the antenna array comprises:
a plurality of truncated pyramidal antenna elements having a top side width in a range of about 80 nm to about 130 nm,
a bottom side width in a range of about 135 nm to about 155 nm, and,
a height in a range of about 100 nm to about 200 nm.

15. A method for manufacturing an illumination device, the method comprising:
providing a substrate;
on the substrate, forming a periodic plasmonic antenna array comprising a plurality of individual antenna elements, the plasmonic antenna array being configured to support a first lattice resonance at a predetermined wavelength, arising from coupling of localized surface plasmon resonances in the individual antenna elements to photonic modes supported by a system comprising the plasmonic antenna array and a wavelength converting layer, wherein the plasmonic antenna array is configured to comprise plasmon resonance modes;
providing a photosensitive layer on the substrate, the photosensitive layer having a thickness exceeding a thickness of the antenna elements so the antenna elements are embedded within and covered by the photosensitive layer;
illuminating the plasmonic antenna array with light of the predetermined wavelength such that an exposed portion of the photosensitive layer is exposed corresponding to a location of maximum field enhancement for light out-coupling resulting from the lattice resonances of the plasmonic antenna array;
removing the exposed portion of the layer to form a plurality of cavities; and
refilling the cavities with a photon emitting material configured to receive energy from an energy source and to emit light of the predetermined wavelength.

16. The illumination device of claim 1, wherein the antenna elements are arranged in a hexagonal array having a lattice constant in a range of about 400 nm to about 600 nm.

* * * * *